(12) United States Patent
Hayashi

(10) Patent No.: US 8,253,328 B2
(45) Date of Patent: Aug. 28, 2012

(54) ORGANIC ELECTROLUMINESCENCE DEVICE, PROCESS OF PRODUCING ORGANIC ELECTROLUMINESCENCE DEVICE, AND ELECTRONIC APPARATUS

(75) Inventor: Kenji Hayashi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 257 days.

(21) Appl. No.: 12/465,988

(22) Filed: May 14, 2009

(65) Prior Publication Data

US 2010/0019654 A1    Jan. 28, 2010

(30) Foreign Application Priority Data

Jul. 24, 2008    (JP) ................................. 2008-190948

(51) Int. Cl.
*H01L 51/50* (2006.01)
(52) U.S. Cl. ............................ 313/512; 445/25; 313/504
(58) Field of Classification Search .................. 313/498, 313/504, 512; 445/24–25
See application file for complete search history.

(56) References Cited

U.S. PATENT DOCUMENTS

| 7,230,271 | B2 | 6/2007 | Yamazaki et al. | |
| 7,538,354 | B2 * | 5/2009 | Hayashi et al. | 257/79 |
| 2004/0124770 | A1 * | 7/2004 | Hayashi et al. | 313/506 |
| 2006/0158111 | A1 * | 7/2006 | Hayashi | 313/512 |
| 2006/0226517 | A1 * | 10/2006 | Iwanaga et al. | 257/639 |
| 2007/0132381 | A1 * | 6/2007 | Hayashi et al. | 313/512 |
| 2007/0228382 | A1 | 10/2007 | Yamazaki et al. | |

FOREIGN PATENT DOCUMENTS

| JP | A-10-312883 | 11/1998 |
| JP | A-2000-223264 | 8/2000 |
| JP | A-2003-282237 | 10/2003 |
| JP | A-2004-095551 A | 3/2004 |
| JP | A-2006-106575 | 4/2006 |
| JP | A-2006-222070 | 8/2006 |
| JP | A-2006-222071 | 8/2006 |
| JP | A-2006-236642 | 9/2006 |
| JP | A-2007-141749 | 6/2007 |
| JP | A-2007-157606 | 6/2007 |
| JP | A-2007-184251 | 7/2007 |
| JP | A-2008-153004 | 7/2008 |

OTHER PUBLICATIONS

English translation of Imai, JP 2007-184251, published Jul. 19, 2007.*

* cited by examiner

*Primary Examiner* — Nimeshkumar Patel
*Assistant Examiner* — Mary Ellen Bowman
(74) *Attorney, Agent, or Firm* — Oliff & Berridge, PLC

(57) ABSTRACT

An organic electroluminescence device includes a substrate, a plurality of light-emitting elements arranged on the substrate, each including a pair of electrodes and an organic light-emitting layer disposed between the electrodes, an organic buffer layer covering the plurality of light-emitting elements, and a gas barrier layer covering the organic buffer layer. The gas barrier layer has a structure wherein first inorganic films and second inorganic films are alternately stacked. The first inorganic films contain a silicon compound containing nitrogen, the second inorganic films contain an oxide of the formation material of the first inorganic films and each have a thickness smaller than that of each first inorganic film. The numbers of the first inorganic films and the second inorganic films are each at least two.

12 Claims, 9 Drawing Sheets

FIG. 7A
FIG. 7B
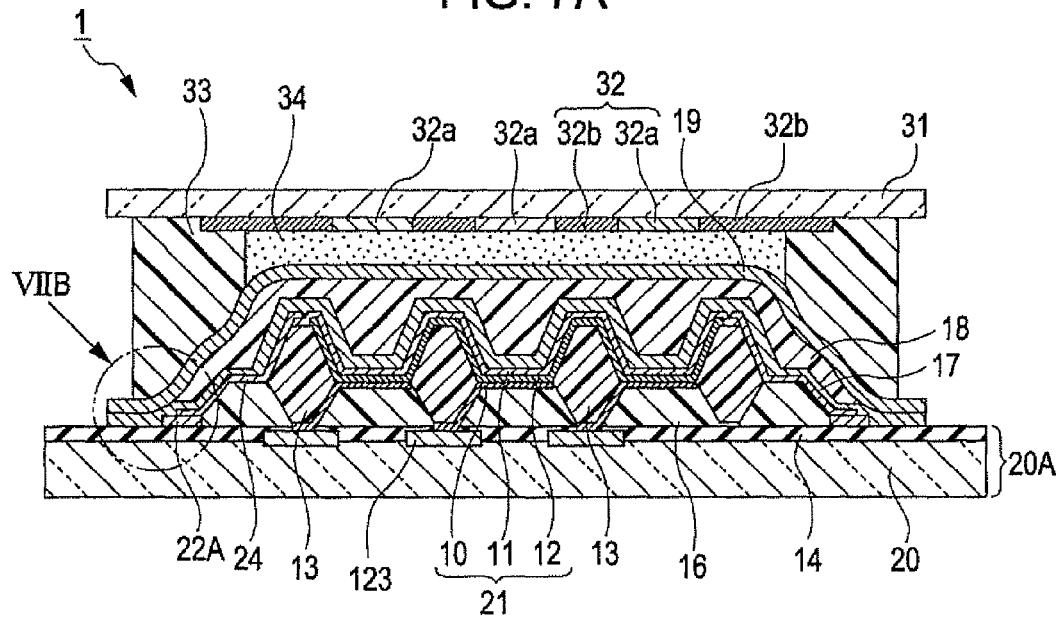
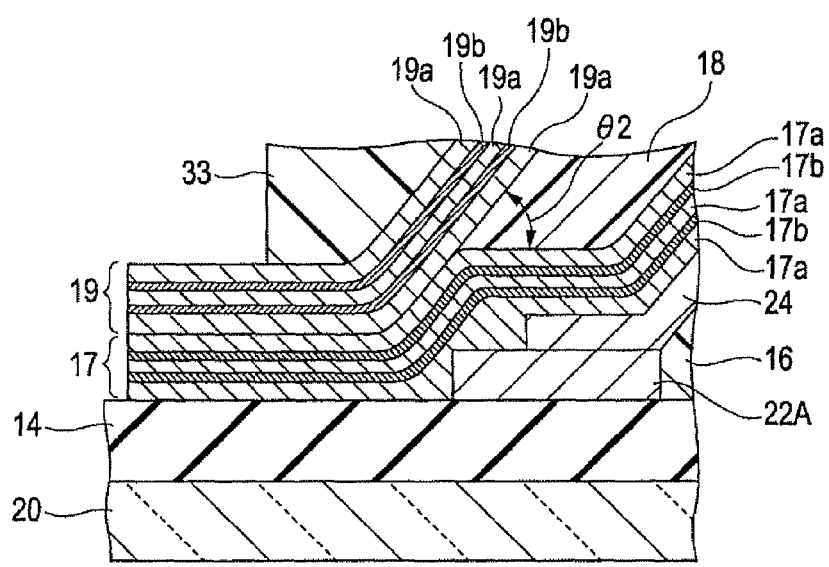

FIG. 9

| | THIN-FILM SEALING LAYER<br>ELECTRODE-PROTECTING LAYER/<br>ORGANIC BUFFER LAYER/<br>GAS BARRIER LAYER | AFTER LEAVING<br>FOR 500 HOURS AT<br>120°C AND 85% RH |
|---|---|---|
| EXAMPLE | GAS BARRIER LAYER: 400 nm<br>(8 LAYERS OF SiOx / 8 LAYERS OF SiON) | NO DECOMPOSITION<br>IN Mg FILM |
| COMPARATIVE<br>EXAMPLE | GAS BARRIER LAYER: 400 nm<br>(8 LAYERS OF SiON ONLY) | DECOMPOSITION<br>IN Mg FILM<br>AT PERIPHERY |

ORGANIC ELECTROLUMINESCENCE DEVICE, PROCESS OF PRODUCING ORGANIC ELECTROLUMINESCENCE DEVICE, AND ELECTRONIC APPARATUS

BACKGROUND

1. Technical Field

The present invention relates to an organic electroluminescence device, a process of producing an organic electroluminescence device, and an electronic apparatus.

2. Related Art

With diversification of information apparatuses, needs for flat displays that consume lower amounts of power and are reduced in weights have increased. As an example of such flat displays, organic electroluminescence devices (hereinafter, referred to as "organic EL devices") having organic light-emitting layers are known.

The organic EL device includes a plurality of organic light-emitting elements (organic EL elements) having a configuration wherein an organic light-emitting layer (light-emitting layer) or a functional layer such as an electron injection layer is disposed between an anode and a cathode. Among these components, the cathode and the electron injection layer are made of materials having properties of easily releasing electrons and thereby react with moisture in the air and are readily deteriorated. The deterioration of these components forms a non-emission region called a dark spot. Therefore, in the organic EL device, a sealing structure for blocking moisture in the air from the organic light-emitting elements is important.

Recently, it has become possible to block the external atmosphere from the organic light-emitting elements by a thin sealing film having a thickness of several micrometers. By using such a sealing technology, a complete solid structure can be realized without providing a hollow structure for filling a gas or a liquid in the inside. The organic EL device having the solid structure makes it possible to significantly reduce the thickness and weight, and therefore it can be expected to make the organic EL device to have further high function and high quality.

In the above-described thin sealing film, infiltration of moisture from the external atmosphere is blocked using an inorganic compound layer that is transparent and has low moisture permeability. Unfortunately, such an inorganic compound layer has a high density, a high Young's modulus, and a high membrane stress and thereby has a disadvantage of being fragile to be easily broken. In addition, the periphery of the organic light-emitting elements covered with the sealing film has asperities due to, for example, pixel partition wall disposed between the light-emitting elements and wiring connected to the light-emitting elements, and therefore the inorganic compound layer particularly tends to be broken at these asperities. An increase in the thickness of the inorganic compound layer for preventing breakage thereof increases the residual stress when the layer is formed. This readily causes warpage and cracking and may rather decrease performance of the layer. Once the sealing film is broken, moisture sequentially infiltrates from the breakage portion, and thereby the light-emitting elements are continuously deteriorated. Then, a dark spot is not only generated at the breakage portion of the sealing film but also grows in all directions with respect to the breakage portion as the center. Therefore, the non-emission region broadens to the circumference thereof, resulting in a significant reduction in product lifetime.

Accordingly, proposed is a configuration where a resin layer for planarizing the asperities and absorbing thermal stress and an inorganic compound layer preventing moisture penetration are stacked (for example, see JP-A-10-312883 and JA-A-2000-223264). In addition, a technology for suppressing breakage, realizing high coverage, and achieving satisfactory sealing by laminating inorganic compound layers made of different materials or having different densities and covering the light-emitting elements with such a laminated structure is proposed (for example, see JP-A-2007-184251 and JA-A-2003-282237).

However, in the case that the inorganic compound layer is laminated on the resin layer, the resin layer is expanded or contracted due to, for example, a change in temperature when the inorganic compound layer is formed on the resin layer, and the inorganic compound layer on an end of the resin layer cannot follow the expansion or contraction and may have cracking. In the case not including the resin layer, it is difficult to planarize the asperities at the periphery of the light-emitting elements, and thereby asperities, which readily cause breakage of the inorganic compound layer, remain, resulting in low reliability of the produced organic EL device.

SUMMARY

An advantage of some aspects of the invention is to provide an organic EL device exhibiting high reliability by being provided with a sealing layer having high endurance. Another advantage of some aspects of the invention is to provide a process of producing such an organic EL device. Further another advantage is to provide an electronic apparatus including such an organic EL device.

The organic electroluminescence device of the invention includes a substrate, a plurality of light-emitting elements arranged on the substrate, each including a pair of electrodes and an organic light-emitting layer disposed between the electrodes, an organic buffer layer covering the plurality of light-emitting elements, and a gas barrier layer covering the organic buffer layer. The gas barrier layer has a structure wherein first inorganic films and second inorganic films are alternately stacked. The first inorganic films contain a silicon compound containing nitrogen, and the second inorganic films contain an oxide of the formation material of the first inorganic films and each have a thickness smaller than that of the first inorganic film. The numbers of the first inorganic films and the second inorganic films are each at least two.

The formation material of the first inorganic film is a silicon compound containing nitrogen. In the silicon compound containing nitrogen, since a nitrogen atom (bond number: 3) mediates a bond between atoms, the number of covalent bonds is large. Consequently, the film has a high density and a high gas barrier property, but, at the same time, the film has a high Young's modulus and is lack of flexibility.

The formation material of the second inorganic film is an oxide of the formation material of the first inorganic film. In such an oxide, since an oxygen atom (bond number: 2) mediates a bond between atoms, the number of covalent bonds between atoms is relatively low compared to that of the formation material of the first inorganic film. Consequently, the film has a lower gas barrier property and a lower Young's modulus than those of the first inorganic film.

In the gas barrier layer of the invention, a plurality of first inorganic films and a plurality of second inorganic films having such properties are alternately stacked. That is, the gas barrier layer has a configuration wherein the second inorganic film having a Young's modulus that is relatively lower than that of the first inorganic film is disposed between two first inorganic films.

When stress is applied to such a gas barrier layer, between two first inorganic films, the second inorganic film that has relatively high flexibility against shear force in the in-plane direction (surface direction of the second inorganic film) deforms larger than the first inorganic film does. Therefore, the inorganic films can largely deform against shear force in the in-plane direction, compared to the case that the second inorganic film is not provided. The gas barrier layer of the invention is provided with a plurality of such laminated structures and thereby can largely deform as a whole. Accordingly, the gas barrier layer can flexibly deform against stress and thereby is hardly broken by the stress, compared to the case that the second inorganic film is not provided.

In addition, since the second inorganic film is thinner than the first inorganic film, the gas barrier property of the first inorganic film is dominant. Consequently, the gas barrier layer strongly reflects the properties of the first inorganic film and thereby exhibits a high gas barrier property.

According to the configuration of the invention, the gas barrier layer can become a layer that has both a high gas barrier property and high endurance to stress. Therefore, an organic EL device having high reliability can be provided.

The organic electroluminescence device of the invention desirably includes an electrode-protecting layer disposed between the plurality of light-emitting elements and the organic buffer layer so as to cover the surfaces of the plurality of light-emitting elements. The electrode-protecting layer has a structure wherein third inorganic films and fourth inorganic films are alternately stacked. The third inorganic films contain a silicon compound containing nitrogen, and the fourth inorganic films contain an oxide of the formation material of the third inorganic film and each have a thickness smaller than that of the third inorganic film. The numbers of the third inorganic films and the fourth inorganic films are each at least two.

By further covering the light-emitting elements with the electrode-protecting layer having the above-mentioned configuration, the gas barrier property can be further increased, resulting in an increase in sealing performance. In addition, the electrode-protecting layer has a laminated structure of the third inorganic films and the fourth inorganic films, as in the gas barrier layer, and thereby becomes a layer that has both a high gas barrier property and high endurance. Therefore, an organic EL device having further high reliability can be provided.

In the invention, the second inorganic film desirably contains silicon atoms and oxygen atoms with a ratio in number of atoms of oxygen to silicon being one or more and two or less.

When the ratio in number of atoms of oxygen to silicon in the second inorganic film is less than one, a difference in Young's modulus between the first inorganic film and the second inorganic film is small, resulting in insufficient flexibility. When the ratio in number of atoms of oxygen to silicon is two, the formation material of the second inorganic film is silicon oxide ($SiO_2$). Therefore, the upper limit of the ratio in number of atoms is two. According to this configuration, a gas barrier layer that deforms to stress can be obtained.

In addition, the fourth inorganic film desirably contains silicon atoms and oxygen atoms with a ratio in number of atoms of oxygen to silicon being one or more and two or less.

When the ratio in number of atoms of oxygen to silicon in the fourth inorganic film is less than one, a difference in Young's modulus between the third inorganic film and the fourth inorganic film is small, resulting in insufficient flexibility. When the ratio in number of atoms of oxygen to silicon is two, the formation material of the fourth inorganic film is silicon oxide ($SiO_2$). Therefore, the upper limit of the ratio in number of atoms is two. According to this configuration, an electrode-protecting layer that deforms to stress can be obtained.

In the invention, the second inorganic film desirably has a thickness of 0.1 nm or more and 10 nm or less.

Since a thickness less than 0.1 nm is about the thickness of one atom of silicon, there is no spreading of the second inorganic film in the in-plane direction between the first inorganic film and the second inorganic film. Consequently, in the in-plane direction, the angle of the covalent bonds contained in the second inorganic film cannot change, and therefore the second inorganic film cannot deform. As a result, the gas barrier layer cannot deform as a whole. Furthermore, the thickness of the second inorganic film is preferably about 10 nm or less in order not to affect the gas barrier property of the first inorganic film. The gas barrier layer having this configuration can have both high endurance and a high gas barrier property.

The fourth inorganic film desirably has a thickness of 0.1 nm or more and 10 nm or less, by the same reasons.

When a thickness of the fourth inorganic film is less than 0.1 nm, there is no spreading of the fourth inorganic film in the in-plane direction between the third inorganic film and the fourth inorganic film. Consequently, the gas barrier layer cannot deform as a whole. Furthermore, the thickness of the fourth inorganic film is preferably about 10 nm or less in order not to affect the gas barrier property of the third inorganic film. According to this configuration, a gas barrier layer that has both high endurance and a high gas barrier property can be obtained.

In the invention, the peripheral end of the organic buffer layer desirably has an angle of 20 degrees or less.

According to this configuration, since the gas barrier layer covering the organic buffer layer does not have a steep angle at the peripheral end of the organic buffer layer, the gas barrier layer at the peripheral end of the organic buffer layer is prevented from being damaged. Therefore, the sealing of the gas barrier layer can be ensured. The phrase "angle at the peripheral end of the organic buffer layer" herein means a contact angle (elevation angle) of the organic buffer layer with respect to the surface of the base on which the organic buffer layer is disposed at the peripheral end of thereof.

The process of producing an organic electroluminescence device of the invention is a process of producing the above-mentioned organic electroluminescence device. The process includes forming a material film containing a silicon compound containing nitrogen and forming an oxide film containing an oxide of the formation material of the material film on the surface of the material film by treating the surface of the material film with oxygen plasma.

According to this process, a thin oxide film can be easily formed, and an organic EL device having satisfactory endurance can be easily produced.

The electronic apparatus of the invention includes the above-mentioned organic electroluminescence device.

According to this configuration, an electronic apparatus can have high endurance and long product lifetime.

BRIEF DESCRIPTION OF THE DRAWINGS

The invention will be described with reference to the accompanying drawings, wherein like numbers reference like elements.

FIG. 7A is a cross-sectional view schematically showing an organic EL device according to a second Embodiment of the invention.

FIG. 7B is an enlarged view showing the cross-section structure of the periphery of the organic EL device, the area encircled by broken line VIIB in FIG. 7A.

FIG. 9 is a table showing the results of Example.

DESCRIPTION OF EXEMPLARY EMBODIMENTS

A First Embodiment

An organic electroluminescence device (organic EL device) according to a first Embodiment of the invention will now be described with reference to FIGS. 1A, 1B, 2A to 2C, 3, 4A, 4B, 5A to 5C, 6A, and 6B. Incidentally, in all the following drawings, film thickness of each component, ratios of sizes, and so on are appropriately changed for easy understanding of the drawings.

Figure 1A:
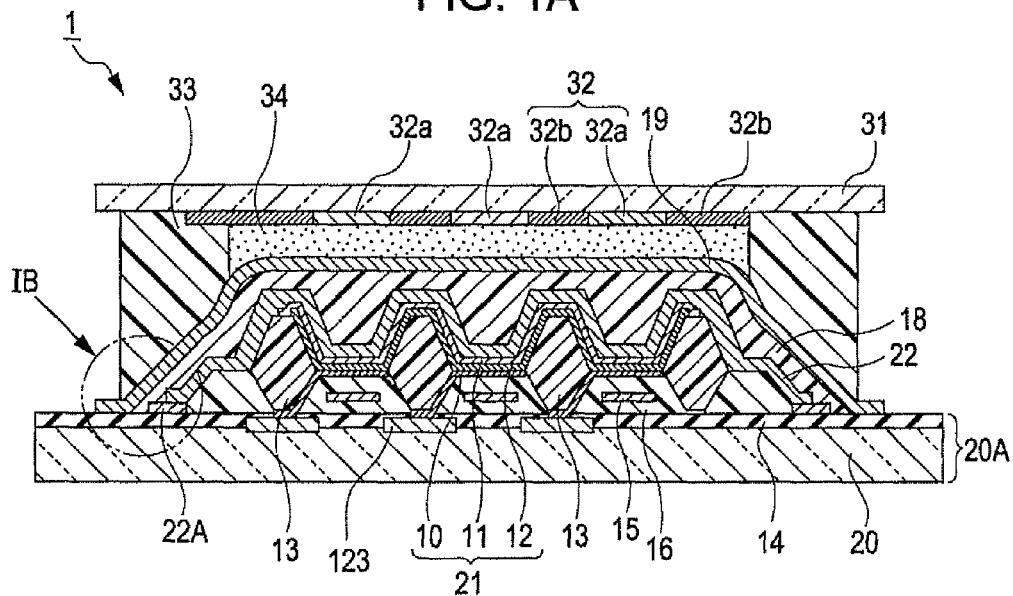
FIG. 1A is a cross-sectional view schematically showing an organic EL device according to a first Embodiment of the invention.
Figure 1B:
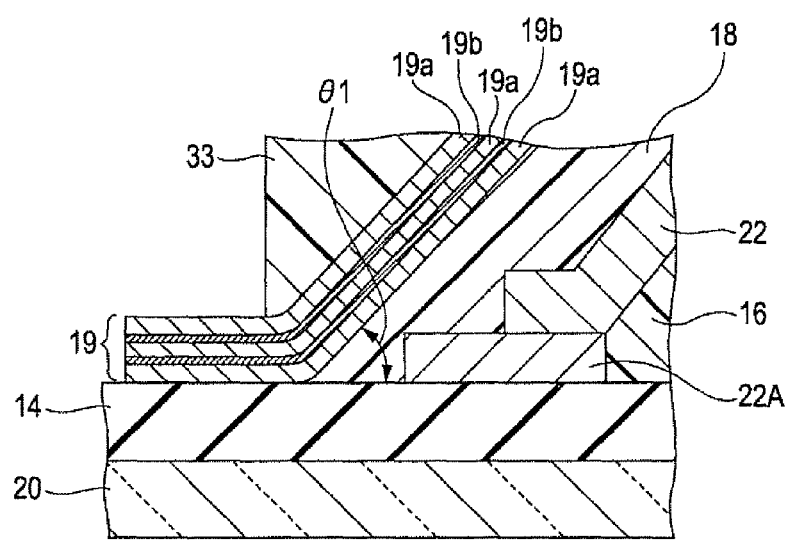
FIG. 1B is an enlarged view showing the cross-section structure of the periphery of the organic EL device, the area encircled by broken line IB in FIG. 1A.

FIGS. 1A and 1B are cross-sectional views schematically showing an organic EL device 1. The organic EL device according to the invention is a so-called "top-emission-type" organic EL device. In the top emission system, light is drawn from an opposite substrate side, not from the side of a substrate on which organic EL elements are arranged. Therefore, the light emission area is not affected by the sizes of various types of circuits arranged on the element substrate, and a large light emission area can be effectively secured. Accordingly, high brightness can be secured, while suppressing the voltage and the current, and thereby a long lifetime of the light-emitting elements can be achieved.

The organic EL device 1 includes an element substrate 20A on which a plurality of light-emitting elements 21 are arranged, an organic buffer layer 18 and a gas barrier layer 19 that are laminated so as to cover the plurality of light-emitting elements 21, and a support substrate 31 facing the element substrate 20A so as to have the plurality of light-emitting elements 21 therebetween. The element substrate 20A and the support substrate 31 are bonded via a sealing layer 33 and an adhesive layer 34. Each of these components will be described in series below.

Element Substrate

The element substrate 20A includes a substrate base 20 and an element layer 14 that is disposed on the substrate base 20 and is provided with various types of wiring and TFT elements. The substrate base 20 may be either a transparent substrate or an opaque substrate. Examples of the opaque substrate include those made of ceramics such as alumina; metal sheets, such as stainless steel sheets, whose surfaces are insulated by, for example, surface oxidation; and thermosetting resins, thermoplastic resins, and films thereof (plastic films). Examples of the transparent substrate include those made of glass, silica glass, inorganic materials such as silicon nitride, and organic polymers (resins) such as acrylic resins and polycarbonate resins. In addition, composite materials formed by stacking or mixing the above-mentioned materials can be used as long as a light-transmitting property is provided. In this Embodiment, the material of the substrate base 20 is glass.

On the substrate base 20, TFTs 123 for driving and various types wiring (not shown) are disposed, and these compositions are covered with an inorganic insulation film to provide an element layer 14. The inorganic insulation film constituting a part of the element layer 14 is made of, for example, silicon oxynitride.

On the element substrate 20A, provided are planarizing layers 16 that absorb surface asperities due to the wiring, TFT elements, and other components disposed on the element substrate 20A, and metal reflection layers 15 that reflect light emitted from the light-emitting elements 21 arranged on the planarizing layers 16 toward the support substrate 31 side. The planarizing layers 16 are made of a resin material having an insulation property and are formed by photolithography. For example, a photosensitive acrylic resin or a cyclic olefin resin is used as the material.

The metal reflection layers 15 are made of the same material as that of the wiring, for example, a metal such as aluminum, titanium, molybdenum, silver, or copper or an alloy thereof, in order to be formed in the same step of forming the wiring and have a light-reflecting property. The metal reflection layers 15 in this Embodiment are made of aluminum and are arranged so as to planarly overlap with the corresponding light-emitting elements 21, which are described below, between the light-emitting elements 21 and the substrate base 20.

The light-emitting elements 21 are arranged on the planarizing layers 16 in regions planarly overlapping with the metal reflection layers 15. Partition wall 13 are disposed between the adjacent light-emitting elements 21 and between the light-emitting elements 21 and the ends of the substrate base 20. In other words, the light-emitting elements 21 are sectioned by the partition wall 13. As in the planarizing layers 16, the partition wall 13 are made of a resin material having an insulation property and are formed by photolithography. For example, a photosensitive acrylic resin or a cyclic olefin resin is used as the material.

The light-emitting elements 21 are each composed of an anode 10 and a cathode 11 and an light-emitting layer 12 disposed therebetween and provided on the corresponding planarizing layer 16 surrounded by the partition wall 13. The thickness of the light-emitting element 21 is about 500 nm, and the thickness (height) of the partition wall 13 is at least 1 µm larger than that of the light-emitting element 21.

The anode 10 is formed on each of the planarizing layers 16 and is connected to the TFT for driving provided on the element substrate 20A. The anode 10 is preferably made of a material having a high hole injection effect of a work function of 5 eV or more. Examples of such materials having a high hole injection effect include metal oxides such as ITO (indium-tin-oxide). In this Embodiment, ITO is used. Incidentally, the anode 10 is not necessarily required to have light transmitting properties and may be a metal electrode, for example, aluminum, which does not transmit light. In such a case, since the anode 10 reflects light and can thereby function as the above-described metal reflection layer 15, the metal reflection layer 15 may not be provided.

The light-emitting layer 12 employed herein is a white-light-emitting layer that emits white light. In this Embodiment, this white-light-emitting layer is formed by vacuum deposition using a low-molecular light-emitting material. Examples of the white-light-emitting material include a light-emitting material that emits white light by simultaneously emitting a layer (blue) obtained by doping a styrylamine-based light-emitting layer with an anthracene dopant and a layer (yellow) obtained by doping a styrylamine-based light-emitting layer with a rubrene dopant. The light-emitting layer herein is formed of a low-molecular light-emitting material, but may be formed of a high-molecular light-emitting material. In addition, it is possible to form a three-layer structure in which white light is drawn by simultaneously emitting three colors, red, green, and blue, by modifying the configuration of layers. Furthermore, the light-emitting layer 12 of the light-emitting element 21 may include a red-light-emitting element having a red-light-emitting layer, a green-light-emitting element having a green-light-emitting layer, and a blue-light-emitting element having a blue-light-emitting layer.

Furthermore, it is preferable that a triarylamine polymer (ATP) layer (hole injection layer) and a triphenyldiamine derivative (TPD) layer (hole transport layer) be disposed between the anode 10 and the light-emitting layer 12 and that aluminum quinolinol (Alq3) layer (electron injection layer) and LiF (electron injection buffer layer) be disposed between the light-emitting layer 12 and the cathode 11, so that electrons and holes from each electrode can be easily injected.

The cathode 11 covers the surfaces of the light-emitting layer 12 and the partition wall 13 and extend so as to reach the tops of the partition wall 13 located at the outermost side (side near the periphery of the element substrate 20A). The cathode 11 is preferably made of a material having high electron injection effect (a work function of 4 eV or less). Examples of the material include calcium, magnesium, sodium, lithium, silver, and metal compounds thereof. Examples of the metal compounds include metal fluorides such as calcium fluoride, metal oxides such as lithium oxide, and organic metal complexes such as calcium acetylacetonate. In these materials, the cathode 11 is generally formed by vacuum deposition. When the cathode 11 is made of a metal oxide having a low vapor pressure, such a cathode 11 may be formed by a high-density plasma film-forming method such as ECR plasma sputtering, ion plating, or facing target sputtering.

On the cathode 11, auxiliary wiring 22 for assisting the conduction of the cathode 11 is disposed. The auxiliary wiring 22 is formed of a transparent metal oxide conductor such as ITO, ZnO (zinc oxide), IZO (indium-zinc-oxide, I Z O: registered trademark), AZO (aluminum-zinc-oxide), or GZO (gallium-zinc-oxide). In this Embodiment, the auxiliary wiring 22 has a large thickness so as to be provided with a function as a protection layer for the cathode 11.

Furthermore, cathode wiring 22A is disposed on the element substrate 20A in the periphery region where the planarizing layers 16 do not exist. The cathode wiring 22A and the cathode 11 are electrically connected to each other via the auxiliary wiring 22.

The cathode wiring 22A is provided for electrically connecting the cathode 11 to a power supply (not shown) and is mainly disposed near the periphery of the element substrate 20A. The cathode wiring 22A is made of an aluminum-silicon alloy or a metal such as titanium, tungsten, molybdenum, or tantalum and is a monolayer or a multilayer of these materials. The outermost layer of the cathode wiring 22A is made of ITO, which is the same material as that of the anode 10. By forming the outermost layer of the cathode wiring 22A by ITO at the same time of forming the anode 10, the cathode wiring 22A is prevented from being corroded when the photolithography is performed in the production process.

Thin-Film Sealing Layer

Furthermore, a thin-film sealing layer that is a laminate composed of a plurality of protection layers is disposed on the element substrate 20A so as to entirely cover the light-emitting elements 21. In the organic EL device 1 of this Embodiment, this thin-film sealing layer includes an organic buffer layer 18 and a gas barrier layer 19.

The organic buffer layer 18 is disposed on the element substrate 20A so as to entirely cover the end faces of the cathode wiring 22A and the surfaces of the cathode wiring 22A and the auxiliary wiring 22. The organic buffer layer 18 is arranged so as to fill the asperities on the surface of the auxiliary wiring 22, which are formed along the shapes of the partition wall 13, and absorb the unevenness. This organic buffer layer 18 absorbs stress caused by warpage or volume expansion of the element substrate 20A and prevents the cathode 11 and the light-emitting layer 12 from being exfoliated from the partition wall 13. In addition, since the unevenness of the upper face of the organic buffer layer 18 is small, the gas barrier layer 19, which is described below, does not have portions in which stress is concentrated, resulting in prevention of cracking. The Young's modulus of the organic buffer layer 18 is preferably in the range of 0.1 GPa or more and 5 GPa or less.

The formation material of the organic buffer layer 18 is preferably an organic compound material that is excellent in fluidity and does not contain a solvent and a volatile component so as to be completely used as the raw material to form a polymer skeleton. Preferred examples of such a formation material include epoxy monomers/oligomers including epoxy groups and having a molecular weight of 3000 or less. Here, a raw material having a molecular weight of less than 1000 is defined as a monomer, and a raw material having a molecular weight of 1000 or more and 3000 or less is defined as an oligomer. Examples of the epoxy monomers/oligomers include bisphenol A-based epoxy oligomers, bisphenol F-based epoxy oligomers, phenol novolac-based epoxy oligomers, polyethylene glycol diglycidyl ethers, alkyl glycidyl ethers, 3,4-epoxycyclohexenylmethyl-3',4'-epoxycyclohexene carboxylate, and ∈-caprolactone modified 3,4-epoxycyclohexylmethyl-3',4'-epoxycyclohexane carboxylate. These epoxy monomers/oligomers are used alone or as a combination thereof.

Furthermore, the formation material of the organic buffer layer 18 contains a curing agent that reacts with the epoxy monomer/oligomer. The curing agent preferably used is one that is excellent in electrical insulation and adhesion and enables to form a cured coating that has high hardness and is excellent in toughness and heat resistance. The curing agent is preferably an addition polymer that is excellent in transparency and low in variation of curing. Preferred examples of such a curing agent include acid anhydride-based curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride. The formation materials, including such a curing agent, of the organic buffer layer 18 behaves as an excellent thermosetting resin. These acid anhydride-based curing agents do not polymerize when carboxylic acid is generated by a reaction thereof with water molecules. Therefore, the formation material of the organic buffer layer 18 is desirably adjusted to have a moisture content of 10 ppm or less.

Furthermore, the curing can be performed at lower temperature by adding a slight amount of an alcohol, such as 1,6-hexanediol, having a large molecular weight and hardly volatilizing or an amine compound such as aminophenol as a reaction accelerating agent that accelerates the reaction (ring-opening) of the acid anhydride. The curing is performed by heating in the range of 60 to 100° C., and the cured coating becomes a polymer having ester bonds.

Furthermore, a cationic photopolymerization initiator, which is broadly used for reducing curing time, may be used, but it is preferable that the curing reaction be slow not to cause sharp progress of curing contraction. In addition, one that forms a cured product lastly by thermosetting is preferred so that planarization is progressed by a reduction in viscosity due to heating after the application. Furthermore, additives, for example, a silane coupling agent, which improve adhesion between the cathode 11 and the gas barrier layer 19, and a moisture capturing agent, such as an isocyanate compound, may be mixed.

The viscosity of a material for forming the organic buffer layer 18 is preferably 2000 mPa·S (at room temperature: 25° C.) or more, to prevent formation of a non-emission region called a dark spot due to penetration of the material into the light-emitting layer 12 immediately after the application. The viscosity of the material for forming the buffer layer containing these raw materials is preferably 4000 mPa·S or more and 10000 mPa·S or less (at room temperature). Generation of air bubbles can be prevented by adjusting the viscosity within this range.

The optimum thickness of the organic buffer layer 18 is preferably 2 μm or more and 5 μm or less. A thicker organic buffer layer 18 can prevent the gas barrier layer 19 from being broken, for example, when a foreign substance invades. However, when the organic buffer layer 18 has a thickness larger than 5 μm, the distance between the light-emitting layer 12 and colored layers 32a, which is described below, becomes large, and the amount of light leaking to the sides is increased, resulting in a reduction in efficiency of drawing light.

On the organic buffer layer 18, the gas barrier layer 19 covering the entire surfaces, including the end faces, of the organic buffer layer 18 is disposed. The ends of the gas barrier layer 19 are in contact with the element layer 14. The gas barrier layer 19 prevents infiltration of oxygen and moisture into the light-emitting elements 21. This can suppress deterioration of the light-emitting elements 21 due to oxygen and moisture.

The gas barrier layer 19 of the invention has a structure in which layers of a silicon compound (such as silicon nitride or silicon oxynitride) containing nitrogen and layers of an oxide thereof are alternately stacked. The total thickness of the gas barrier layer 19 is preferably 100 nm or more and 800 nm or less. A gas barrier layer 19 whose thickness is smaller than 100 nm is easily broken because of the small thickness thereof. Contrarily, a thickness larger than 800 nm, for example, 1000 nm or more, readily causes cracking because of reductions in film stress and flexibility and is therefore not preferable. In view of productivity as well as sealing performance, the thickness is preferably 200 nm or more and 500 nm or less. The configuration and the production process of the gas barrier layer 19 are described in detail below.

In the drawing, the gas barrier layer 19 is smaller (narrower) than the element substrate 20A, but the gas barrier layer 19 may extend to the end of the element substrate 20A When a plurality of substrates are formed on a single large substrate and are separated from one another during the production process, that is, so-called multiple beveling, is performed in order to promote efficiency, a panel including the gas barrier layer 19 may be cut after adhesion of the support substrate 31.

Support Substrate

The support substrate 31 and a color filter layer 32 provided on the support substrate 31 are disposed so as to face the element substrate 20A.

The support substrate 31 is a substrate having a light-transmitting property for transmitting the light emitted from the light-emitting elements 21 and strength for protecting the thin-film sealing layer. The support substrate 31 can be formed of, for example, glass, silica glass, an inorganic material such as silicon nitride, or an organic polymer (resin) having a light-transmitting property, such as a polyethylene terephthalate resin, an acrylic resin, a polycarbonate resin, or a polyolefin resin. In addition, composite materials formed by stacking or mixing the above-mentioned materials can be used as long as light-transmitting properties are provided. Among them, a glass substrate is preferably used from high transparency and low moisture permeability thereof. In addition, a layer shielding or absorbing ultraviolet rays or a functional layer such as a light reflection preventing film or a heat radiating layer may be provided.

The color filter layer 32 is disposed on the support substrate 31. In the color filter layer 32, colored layers 32a that modulate transmitted light to any one of red (R), green (G), and blue (B) colors are arranged in a matrix form. The colored layers 32a are made of a mixture of a pigment or a dye showing a red, green, or blue color and a resin such as an acrylic resin. In addition, according to need, colored layers 32a of, for example, light blue, light cyan, and white colors may be provided.

The colored layers 32a are arranged such that each of them faces the corresponding light-emitting element 21 that emits white light. By doing so, the light emitted from each light-emitting element 21 transmits through the corresponding colored layer 32a and is emitted toward a viewer as red, green, or blue light. Thus, color display is performed.

Furthermore, black matrix layers 32b for preventing light leakage and improving visibility are disposed between adjacent colored layers 32a and the circumferences of the colored layers 32a. The black matrix layers 32b are made of a resin colored to black.

In the color filter layer 32, the thickness of the colored layer 32a is adjusted to be suitable for each color within the range of 0.5 μm or more and 2 μm or less, and the thickness of the black matrix layer 32b is adjusted to be about 1 μm.

Sealing Layer

The element substrate 20A and the support substrate 31 are bonded to each other with a sealing layer 33 arranged near the periphery of the element substrate 20A.

The sealing layer 33 prevents moisture from infiltrating into the inside of the organic EL device 1 and fixes a position where the element substrate 20A and the support substrate 31 are bonded to each other.

The sealing layer 33 is disposed so as to overlap with the marginal end of the organic buffer layer 18. In many cases, the organic buffer layer 18 and the gas barrier layer 19 are made of materials having different coefficients of thermal expansion, and this difference in the coefficient of thermal expansion may cause breakage of the gas barrier layer 19. Such breakage is prone to occur at the end of the organic buffer layer 18 where the shape of the gas barrier layer 19 changes. However, breakage, such as cracking and peeling of the gas barrier layer 19, caused by concentration of stress can be avoided by disposing the gas barrier layer 19 between the sealing layer 33 and the organic buffer layer 18.

The formation material of the sealing layer 33 is preferably composed of a resin material whose viscosity is increased by being cured with ultraviolet irradiation. Preferred examples of such materials include epoxy monomers/oligomers including epoxy groups and having a molecular weight of 3000 or less. Here, one that has a molecular weight of less than 1000 is defined as a monomer, and one that has a molecular weight of 1000 or more and 3000 or less is defined as an oligomer. Examples of the epoxy monomers/oligomers include bisphenol A-based epoxy oligomers, bisphenol F-based epoxy oligomers, phenol novolac-based epoxy oligomers, 3,4-epoxycyclohexenylmethyl-3',4'-epoxycyclohexene carboxylate, and ∈-caprolactone modified 3,4-epoxycyclohexylmethyl-3',4'-epoxycyclohexane carboxylate. These epoxy monomers/oligomers are used alone or as a combination thereof.

In addition, the formation material of the sealing layer 33 includes a curing agent that reacts with the epoxy monomer/oligomer. The curing agent is preferably a photoreactive initiator that causes cationic polymerization reaction, mainly, with ultraviolet irradiation, and examples thereof include diazonium salts, diphenyliodonium salts, triphenylsulfonium salts, sulfonate esters, iron-arene complexes, and silanol-aluminum complexes. The formation materials of the sealing layer 33 containing these curing agents behave as light (ultraviolet) setting resins.

The viscosity of the formation material of the sealing layer 33, when it is applied, is preferably 10 Pa·S or more and 200 Pa·S or less (at room temperature). By using an additive called a cation-holding agent whose viscosity gradually increases after ultraviolet irradiation, not only that a light irradiation step after the bonding step can be omitted, but also that the formation material of the sealing layer 33 does not easily flow, resulting in easiness in the bonding step. Furthermore, the sealing layer 33 can be prevented from rupture even if it has a narrow width of 1 mm or less, and leakage of the filler after the bonding can be prevented. Thus, the use of the additive is preferred. Furthermore, a material whose moisture content is adjusted to 1000 ppm or less is preferred.

Generally, in many cases, the material for forming the sealing layer 33 contains a filler such as spherical particles (spacer) having a prescribed particle size for controlling the distance between the substrates or an inorganic material (inorganic filler) having a flake or aggregate shape for adjusting the viscosity. Unfortunately, these fillers may damage the gas barrier layer 19 when pressure bonding is performed. Therefore, in this Embodiment, the formation material of the sealing layer 33 does not contain these fillers.

The inside of the organic EL device 1, being surrounded by the sealing layer 33, is filled with the adhesive layer 34 without leaving any space. The adhesive layer 34 fixes the support substrate 31 to the element substrate 20A so as to face the element substrate 20A, maintains a constant distance between the color filter layer and the element substrate 20A, and protects the thin-film sealing layer from mechanical impacts from the outside by buffering function thereof.

The formation material of the adhesive layer 34 is preferably an organic material (transparent adhesive) that has a light-transmitting property and adhesion function and also that is excellent in fluidity and does not contain a volatile component such as a solvent. As such a formation material, a resin adhesive, such as an acrylic, epoxy, or urethane-based adhesive, can be used. In view of heat resistance and water resistance, an epoxy-based adhesive is preferred. Examples of the formation material of the sealing layer include epoxy monomers/oligomers having a molecular weight of 3000 or less, and they are used alone or as a combination thereof.

Furthermore, the formation material of the adhesive layer 34 contains, as an additive, a curing agent that reacts with the epoxy monomer/oligomer. The curing agent preferably used is one that is excellent in electrical insulation and enables to form a cured coating that is excellent in toughness and heat resistance. The curing agent is preferably an addition polymer that is excellent in transparency and low in variation of curing. Preferred examples of such a curing agent include acid anhydride-based curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3',4,4'-benzophenonetetracarboxylic dianhydride, and polymers thereof. In addition, amine curing agents such as aromatic amines and aliphatic amines may be used. The formation material, including such a curing agent, of the adhesive layer 34 behaves as a thermosetting resin. As another additive, a silane coupling agent that improves adhesion with the gas barrier layer 19 may be further contained.

The formation material of the adhesive layer 34 is cured by heating in the range of 80 to 120° C., and the resulting cured coating becomes a polymer having ester bonds that are excellent in adhesion with silicon oxynitride. Furthermore, the formation material of the adhesive layer 34 does not contain fillers such as a spacer and an inorganic filler by the same reasons as those in the formation material of the sealing layer 33.

The viscosity of the formation material of the adhesive layer 34, when it is applied, is preferably from 100 to 1000 mPa·S (at room temperature). The reason of this is based on consideration of space-filling properties of the material after the bonding, and a material whose curing starts after a decrease in viscosity once immediately after the heating is preferred. In addition, the moisture content of the material is preferably adjusted to 1000 ppm or less.

FIG. 1B is a cross-sectional view showing the cross-section structure of the periphery of the organic EL device 1, the area encircled by broken line IB in FIG. 1A.

The organic buffer layer 18 covers the cathode wiring 22A and the auxiliary wiring 22, which stepwise overlap with each other, and is in contact with the element layer 14. The asperities due to the underlying shape are absorbed by the organic buffer layer 18, and the asperities on the surface of the organic buffer layer 18 are small.

The elevation angle (angle of the peripheral end) θ1 of the organic buffer layer 18 at the peripheral end to the surface direction of the element substrate 20A is preferably 20 degrees or less and is particularly preferably about 10 degrees. By doing so, damages such as cracking and peeling due to concentration of stress in the gas barrier layer 19 covering the peripheral end 35 of the organic buffer layer 18 can be prevented. In this Embodiment, the elevation angle θ1 is 10 degrees.

The gas barrier layer 19 is composed of first gas barrier layers (first inorganic film, material film) 19a made of a silicon compound containing nitrogen and second gas barrier layers (second inorganic film, oxide film) 19b made of an oxide of the formation material of the first gas barrier layers, and the first and second gas barrier layers are alternately stacked.

The first gas barrier layer 19a is made of a silicon compound containing nitrogen and exhibiting a low moisture permeability and a high gas barrier property. Examples such a compound include silicon nitride and silicon oxynitride. The first gas barrier layers 19a in this Embodiment each have a thickness of 50 nm.

The amount of the nitrogen atoms contained in the formation material of the first gas barrier layer 19a can be suitably controlled. An increase in the amount of nitrogen atoms increases the number of covalent bonds between atoms (increase of covalent bond density), resulting in formation of a layer through which moisture hardly permeates (high gas barrier property). The gas barrier property, for example, resistance to moisture permeability can be evaluated by determining water vapor transmission rate specified in JIS-K-7129 "testing method for water vapor transmission rate of plastic film and sheeting (instrument method)". For example, the water vapor transmission rate of a silicon oxynitride film with a thickness of 100 nm is 0.05 g/m$^2$·day or less when evaluated by a JIS-K7129B method.

On the other hand, an increase of nitrogen atoms contained in the formation material of the first gas barrier layer 19a causes an increase in Young's modulus, resulting in loss of flexibility. The Young's modulus of silicon nitride is 300 GPa, and the Young's modulus of silicon oxide is 100 GPa. The Young's modulus of silicon oxynitride is from 100 to 300 GPa depending on the quantitative ratio of oxygen and nitrogen. In the first gas barrier layer 19a of this Embodiment, the amount of nitrogen is controlled such that the Young's modulus is in the range of 150 to 300 GPa.

The second gas barrier layer 19b is made of an oxide of the formation material of the first gas barrier layer 19a. Therefore, the formation material of the second gas barrier layer 19b has a structure where all or part of the nitrogen atoms in the formation material of the first gas barrier layer 19a are substituted with oxygen atoms. An increase in the amount of oxygen atoms reduces the number of covalent bonds between atoms (decrease of covalent bond density), resulting in formation of a layer that allows, for example, moisture to permeate therethrough more easily (low gas barrier property) than the first gas barrier layer 19a does. For example, the water vapor transmission rate of a silicon oxide film with a thickness of 100 nm is 0.1 to 0.5 g/m$^2$·day when evaluated by the JIS-K7129B method. The gas barrier property is the highest when the ratio of oxygen atoms to silicon atoms of silicon oxide is about 1.5 to about 1.7.

On the other hand, since the covalent bond density of the second gas barrier layer 19b is lower than that of the formation material of the first gas barrier layer 19a, the second gas barrier layer 19b has a relatively low Young's modulus.

The gas barrier layer 19 of the invention is composed of the first gas barrier layers 19a and the second gas barrier layers 19b, having such properties, that are alternately stacked. That is, the gas barrier layer 19 has a configuration in which the second gas barrier layer 19b having a relatively low Young's modulus is disposed between two first gas barrier layers 19a. The second gas barrier layer 19b is formed by oxidizing the surface of the first gas barrier layer 19a and has a very small thickness of about 1 to 10 nm.

The thickness of the second gas barrier layer 19b can be measured, for example, by measuring oxygen concentration distribution in a cross section of the gas barrier layer 19 formed and determining a position where the oxygen concentration varies as the interface between the first gas barrier layer 19a and the second gas barrier layer 19b.

When stress is applied to the gas barrier layer 19 having such a configuration, between two first gas barrier layers 19a, the second gas barrier layer 19b having relatively high flexibility is deformed largely, compared to the first gas barrier layers 19a. Consequently, a larger deformation is possible, compared to the case that the second gas barrier layer 19b is not provided. In addition, since the gas barrier layer 19 includes a plurality of second gas barrier layers 19b, large deformation is possible as a whole by that each of the second gas barrier layer 19b deforms, even if the deformation of each second gas barrier layer 19b is small. Accordingly, the gas barrier layer 19 can flexibly deform against stress, compared to the case that the second gas barrier layer 19b is not provided, and therefore is hardly broken by stress.

The second gas barrier layer 19b is a very thin film, and thereby the gas barrier performance mainly depends on the first gas barrier layer 19a. Consequently, the gas barrier layer 19 reflects the properties of the first gas barrier layer 19a and accordingly exhibits a high gas barrier property.

As a result, the gas barrier layer 19 becomes a layer that has both a high gas barrier property and high endurance against stress.

The organic EL device 1 according to this Embodiment has the above-described configuration. Process of producing organic EL device Next, a process of producing the organic EL device 1 in this Embodiment will be described with reference to FIGS. 2A to 2C, 3, 4A, 4B, 5A to 5C, 6A, and 6B.

Figure 2A:
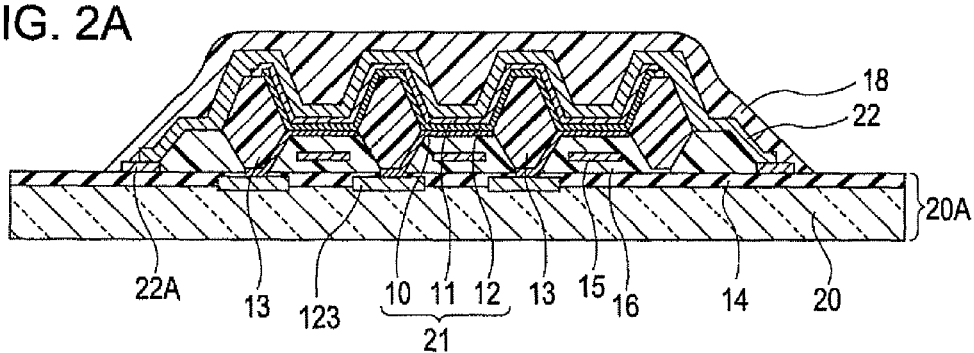
FIG. 2A is a diagram showing a process of producing the organic EL device according to the first Embodiment.

First, as shown in FIG. 2A, an organic buffer layer 18 is formed on the element substrate 20A that has been already provided with auxiliary wiring 22 and other components. Specifically, first, a formation material of the organic buffer layer 18 is arranged on the auxiliary wiring 22 by screen printing under reduced pressure atmosphere. By arranging the formation material of the organic buffer layer 18 under reduced pressure atmosphere, volatile impurities and water contained in the formation material of the organic buffer layer 18 and screen mesh can be removed as much as possible to prevent air bubbles from being generated during the application. The screen printing forcibly planarizes the surface of the arranged material by rubbing with a squeegee and thereby can give a more planarized surface, compared to that by other methods for arranging a material.

Subsequently, the arranged formation material of the organic buffer layer 18 is heated in the range of 60 to 100° C. for curing. This heat curing is performed under nitrogen atmosphere which is controlled such that moisture at atmospheric pressure is 10 ppm or less. On this occasion, in general, the viscosity of the formation material of the organic buffer layer 18 is temporarily decreased during the period from immediately after the heating to initiation of the reaction. Therefore, the formation material may penetrate through an electrode-protecting layer 17 or the cathode 11 and infiltrate in the light-emitting layer 12 to generate dark spots. Accordingly, it is preferable that the curing be performed at a low temperature of 60 to 80° C. until the curing progresses to some degree and then the curing is completed by increasing the temperature to 80° C. or higher when the reaction progresses to a degree that gives high viscosity.

Figure 2B:
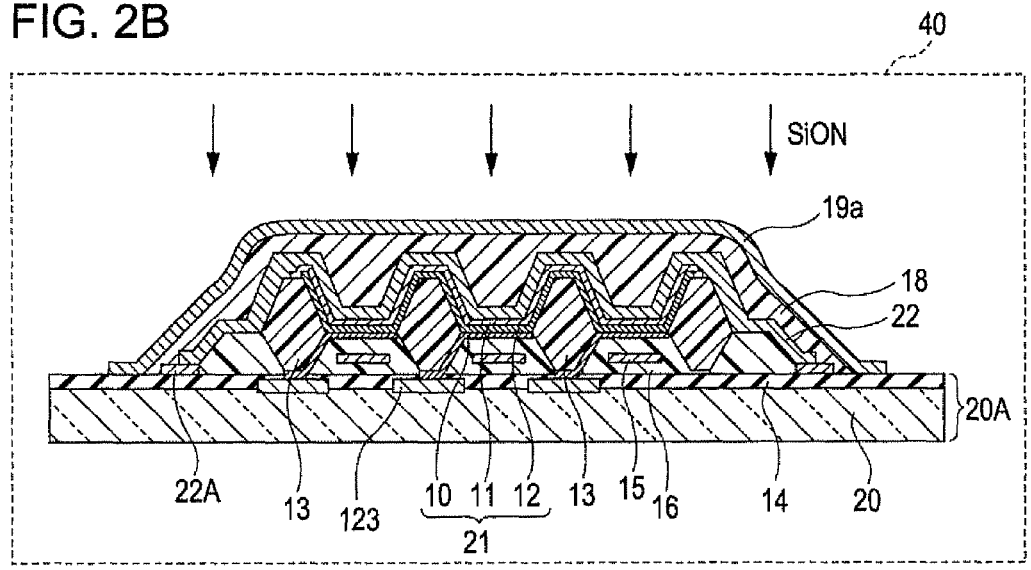
FIG. 2B is a diagram showing a process of producing the organic EL device according to the first Embodiment.

Then, as shown in FIG. 2B, a silicon oxynitride film is formed on the organic buffer layer 18 as the first gas barrier layer 19a. Specifically, the film is formed by a high-density plasma film-forming method, such as an ECR (electron cyclotron resonance) plasma sputtering method, an ion plating method (e.g., pressure-gradient-type plasma gun film-forming method), an ICP (inductively coupled plasma)-CVD method, or an SWP (surface wave plasma)-CVD method. The drawing herein shows formation of the film using an ICP-CVD system 40 described below.

Figure 2C:
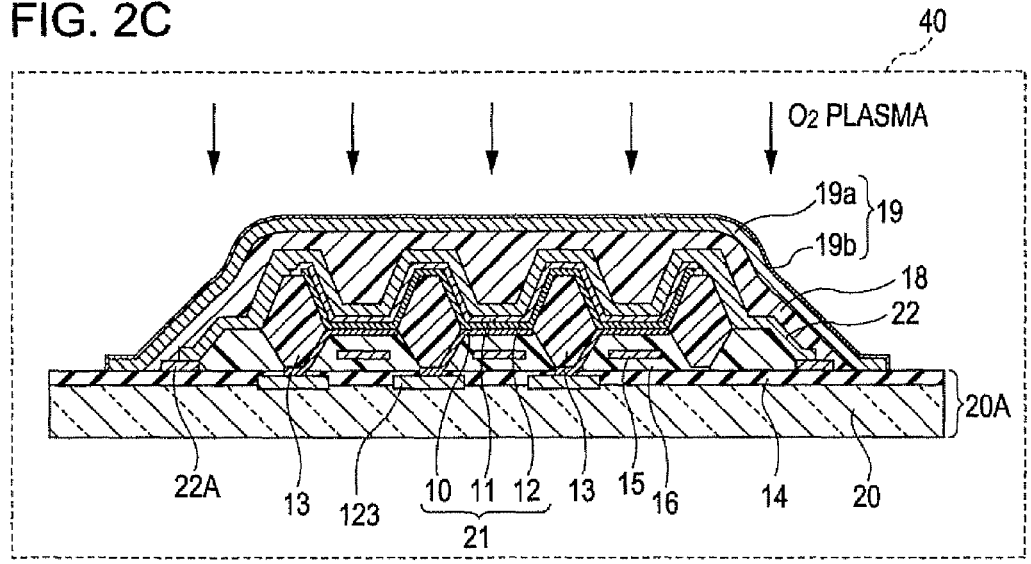
FIG. 2C is a diagram showing a process of producing the organic EL device according to the first Embodiment.

Then, as shown in FIG. 2C, the surface of the first gas barrier layer 19a is oxidized by oxygen plasma treatment to form the second gas barrier layer 19b having a very small thickness. The drawing herein shows formation of the film using the ICP-CVD system 40 described below.

By repeating the treatment shown in FIGS. 2B and 2C for necessary times, the gas barrier layer 19 composed of alternately stacked first gas barrier layers 19a and second gas barrier layers 19b can be formed.

Figure 3:
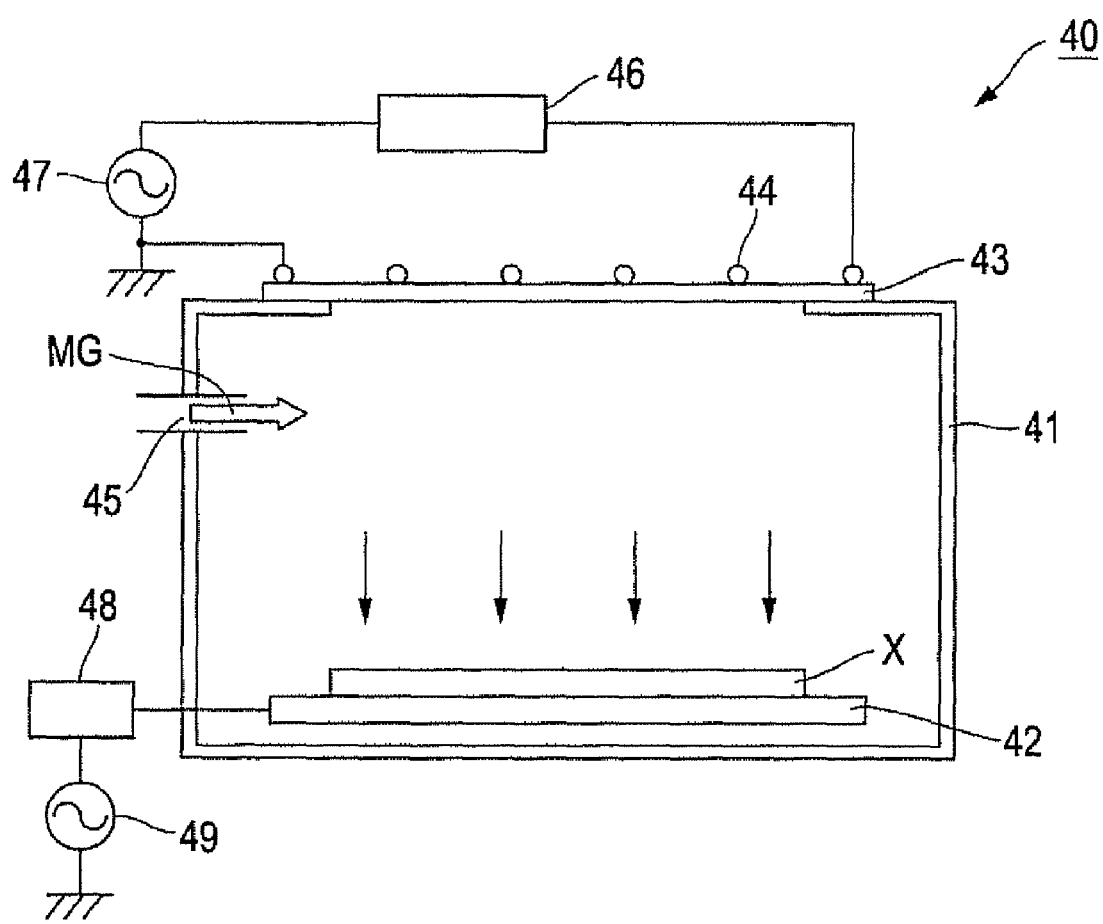
FIG. 3 is an explanatory diagram showing an ICP-CVD system for forming a film by ICP-CVD.
Figure 4A:
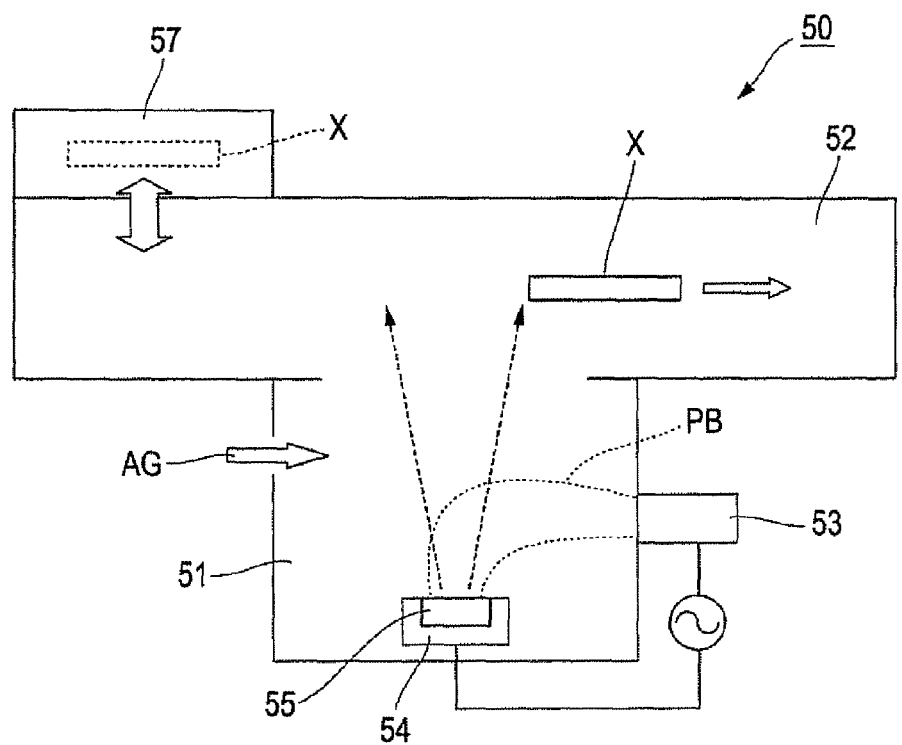
FIG. 4A is an explanatory diagram showing a film-forming system that is used for forming a film with a pressure-gradient-type plasma gun.
Figure 4B:
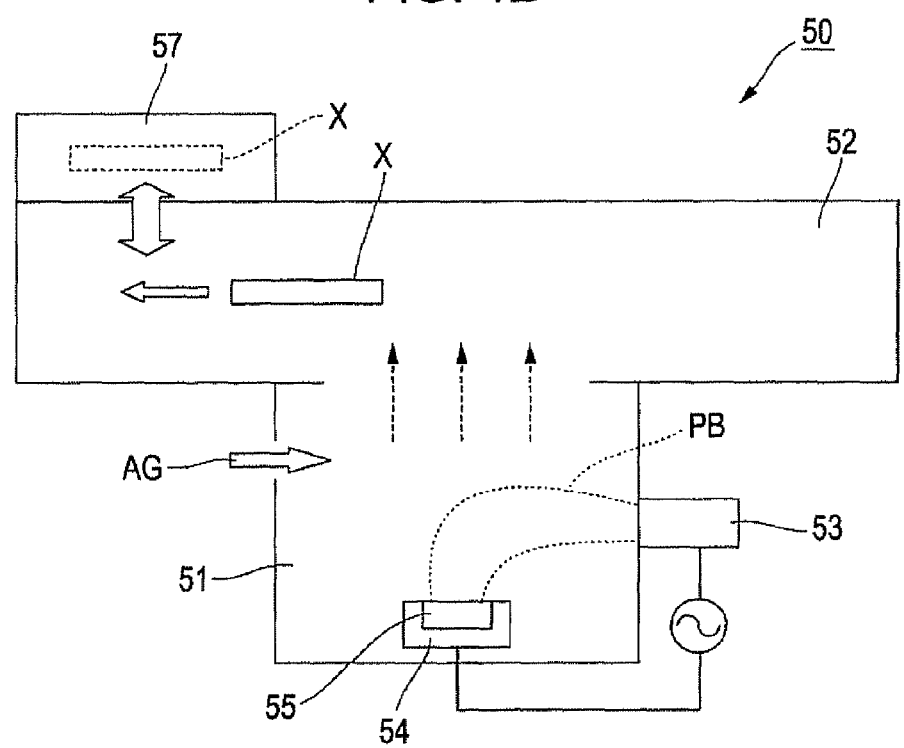
FIG. 4B is an explanatory diagram showing a film-forming system that is used for forming a film with a pressure-gradient-type plasma gun.

The method for forming the gas barrier layer 19 will be described in further detail with reference to FIGS. 3, 4A, and 4B. The gas barrier layer 19 can be formed by the above-mentioned high-density plasma film-forming method, and preferred as methods that can provide a film with a large area and exhibit high production efficiency are the ICP-CVD film-forming method and the pressure-gradient-type plasma gun film-forming method, which can perform transfer film formation. FIG. 3 is a diagram showing the ICP-CVD system used for the ICP-CVD film-forming method. FIGS. 4A and 4B are diagrams showing an ion-plating film-forming system using a pressure-gradient-type plasma gun.

As shown in FIG. 3, the ICP-CVD system 40 includes a chamber 41 made of an electrically conductive material, a susceptor 42 placed inside the chamber 41 and supporting a substrate X to be treated thereon, a dielectric wall 43 provided on the ceiling of the chamber 41, and a high-frequency antenna 44 disposed on the dielectric wall 43 at the outside of the chamber 41. The susceptor 42 has a built-in heating mechanism for heating a substrate X placed on the susceptor 42 for being treated. In addition, supply tubes 45 for supplying various kinds of raw material gases MG to the inside of the chamber 41 are provided independently from one another on the wall of the chamber 41. The number of the supply tubes 45 is the same as the number of kinds of the gas used for reaction. Furthermore, the chamber 41 is appropriately provided with an exhaust outlet (not shown).

The high-frequency antenna 44 is connected to a first high-frequency power supply 47 via a first matching box 46. The first high-frequency power supply 47 supplies high-frequency electricity to the high-frequency antennas 44 such that the output is sufficient for generating inductively coupled plasma by the high-frequency antennas 44. The susceptor 42 is connected to a second high-frequency power supply 49 for supplying high-frequency bias electricity via a second matching box 48.

The ICP-CVD system 40 energizes the high-frequency antennas 44 to generate an induction electric field and introduces a raw material gas MG into the chamber 41 via the supply tube 45 to generate plasma originated from the raw material gas, and thereby a film is formed on the substrate X to be treated in the chamber 41.

In order to form the first gas barrier layer 19a using this ICP-CVD system 40, silane ($SiH_4$), ammonia ($NH_3$), and dinitrogen monoxide ($N_2O$) are supplied as raw material gases into the chamber 41 and are atomized and excited by inductively coupled plasma generated in the chamber 41, resulting in formation of a film on the substrate X to be treated. This corresponds to the film formation treatment of the production process shown in FIG. 2B.

Similarly, in order to form the second gas barrier layer 19b, oxygen ($O_2$) as a raw material gas and argon (Ar) as an atmospheric gas are supplied to the chamber 41 to generate oxygen plasma in the chamber 41 for oxidizing the surface of the first gas barrier layer 19a, resulting in formation of a thin oxide film as the second gas barrier layer 19b. This corresponds to the film formation treatment of the production process shown in FIG. 2C.

By repeating the above-described steps for necessary times, the gas barrier layer 19 composed of alternately stacked first gas barrier layers 19a and second gas barrier layers 19b can be formed.

FIGS. 4A and 4B are diagrams schematically showing an ion-plating film-forming system 50 equipped with a pressure-gradient-type plasma gun. FIG. 4A is a schematic diagram showing the way of forming the first gas barrier layer 19a, and FIG. 4B is a schematic diagram showing the way of forming the second gas barrier layer 19b.

The ion-plating film-forming system 50 includes a chamber 51, a film-forming chamber 52 connected to the chamber 51, a pressure-gradient-type plasma gun 53 connected to a side wall of the chamber 51, a hearth 54 made of an electrically conductive material and disposed at the bottom of the chamber 51, and an evaporation material 55 placed in a recess of the hearth 54. The hearth 54 has a built-in hearth magnet. The hearth magnet conducts plasma beams PB of Ar plasma emitted from the plasma gun 53 to the hearth 54. The wall face of the chamber 51 is appropriately provided with a supply port 56 for supplying a film-forming atmospheric gas AG into the chamber 51 and an exhaust outlet (not shown).

The film-forming chamber 52 has a transfer mechanism therein, which reciprocates in the film-forming chamber 52 and transfers a substrate X to be treated placed thereon. The film-forming chamber 52 has a carrying-in portion 57 for carrying out a treated substrate X provided with a film and carrying in an untreated substrate X.

In the ion-plating film-forming system 50, an evaporation material 55 placed on the hearth 54 is irradiated with plasma beams PB emitted from the plasma gun 53, and thereby the evaporation material 55 evaporates. The evaporated evaporation material 55 adheres to a substrate X to be treated, which is transferred in the film-forming chamber 52. Thus, a film is formed on the substrate X. The evaporation material 55 is a material, such as Si or $SiO_2$, selected according to the kind of a film to be formed.

In order to form the first gas barrier layer 19a with the ion-plating film-forming system 50, for example, as shown in FIG. 4A, a film is formed by supplying argon (Ar) and nitrogen ($N_2$) as the film-forming atmospheric gases AG and simultaneously evaporating an evaporation material 55 with plasma beams PB irradiation during that a substrate X to be treated is transferred in one direction. This corresponds to the film formation treatment of the production process shown in FIG. 2B.

Similarly, in order to form the second gas barrier layer 19b, for example, as shown in FIG. 4B, during that the substrate X is transferred in the other direction, a thin oxide film as the second gas barrier layer 19b is formed by supplying argon (Ar) and oxygen ($O_2$) as the film-forming atmospheric gases AG and performing irradiation with plasma beams PB having lowered output not to evaporate the evaporation material 55. By doing so, oxygen plasma is generated in the chamber 51, and the surface of the first gas barrier layer 19a is oxidized by the oxygen plasma. This corresponds to the film formation treatment of the production process shown in FIG. 2C.

By repeating the above-described steps for necessary times, the gas barrier layer 19 composed of alternately stacked first gas barrier layers 19a and second gas barrier layers 19b can be formed.

Figure 5A:
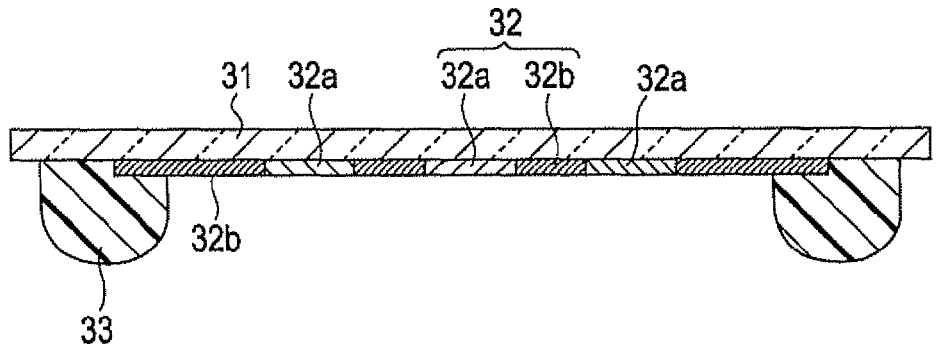
FIG. 5A is a diagram showing a process of producing the organic EL device according to the first Embodiment.

At the same time, as shown in FIG. 5A, a material for forming the sealing layer 33 is arranged at the circumference of the support substrate 31 provided with color filter layer 32. Specifically, the formation material of the sealing layer 33 is applied to the circumference of the support substrate 31 by needle dispensing. The application may be performed by screen printing. The viscosity of the formation material of the sealing layer 33 according to this Embodiment is 50 Pa·S (at room temperature) when it is applied. The moisture content is adjusted in advance to 1000 ppm or less.

Figure 5B:
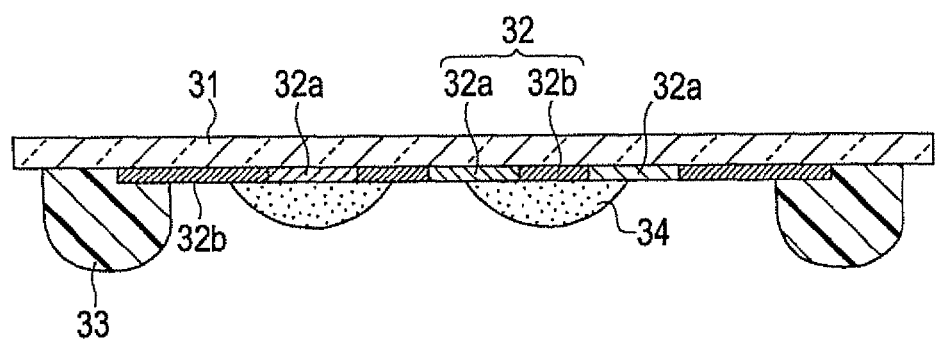
FIG. 5B is a diagram showing a process of producing the organic EL device according to the first Embodiment.

Then, as shown in FIG. 5B, a formation material of the adhesive layer 34 is arranged inside a portion surrounded by the formation material of the sealing layer 33 arranged on the support substrate 31. The arrangement is performed by jet dispensing for application. The formation material of the adhesive layer 34 is not necessarily applied to the entire surface of the support substrate 31, and a necessary amount of the material may be applied to a plurality of places on the support substrate 31. The viscosity of the formation material of the adhesive layer 34 according to this Embodiment is 500 mPa·S (at room temperature) when it is applied. The viscosity of the formation material of the sealing layer 33 is sufficiently higher than that of the formation material of the adhesive layer 34 and thereby can function as a bank for preventing the formation material of the adhesive layer 34 from protruding.

Figure 5C:
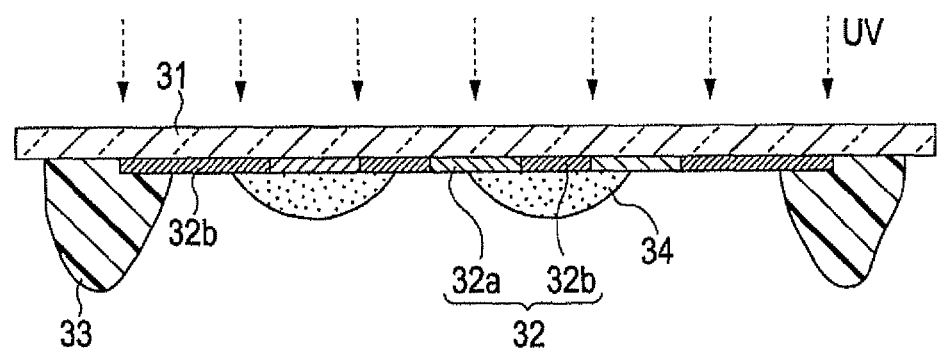
FIG. 5C is a diagram showing a process of producing the organic EL device according to the first Embodiment.

Then, as shown in FIG. 5C, the support substrate 31 applied with the sealing layer 33 and the adhesive layer 34 is irradiated with ultraviolet rays. For example, each of the formation materials arranged on the support substrate 31 is irradiated with ultraviolet rays at an illuminance of 30 mW/cm$^2$ and at an intensity of 2000 mJ/cm$^2$. By doing so, the formation material of the sealing layer 33 containing a photoreactive initiator preferentially reacts to start curing, resulting in an increase in the viscosity of the formation material of the sealing layer 33.

Figure 6A:
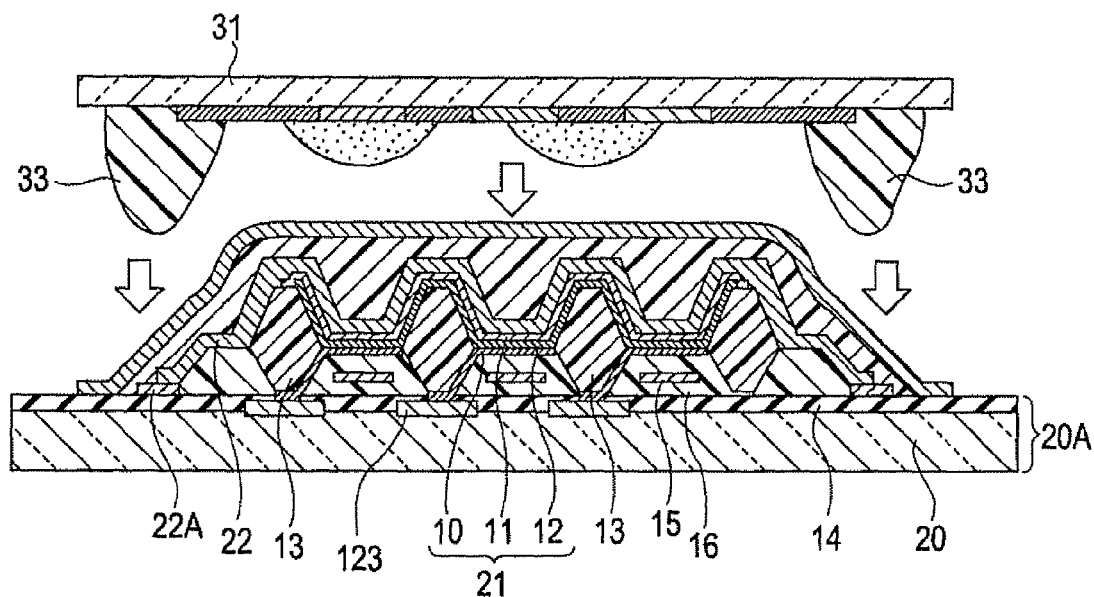
FIG. 6A is a diagram showing a process of producing the organic EL device according to the first Embodiment.

Subsequently, as shown in FIG. 6A, alignment work of the substrates is performed to bond the support substrate 31 having the sealing layer 33 that has started to cure shown in FIG. 5C to the element substrate 20A that has been already provided with the gas barrier layer 19 and other components shown in FIG. 2C. The bonding is performed under reduced pressure atmosphere.

Figure 6B:
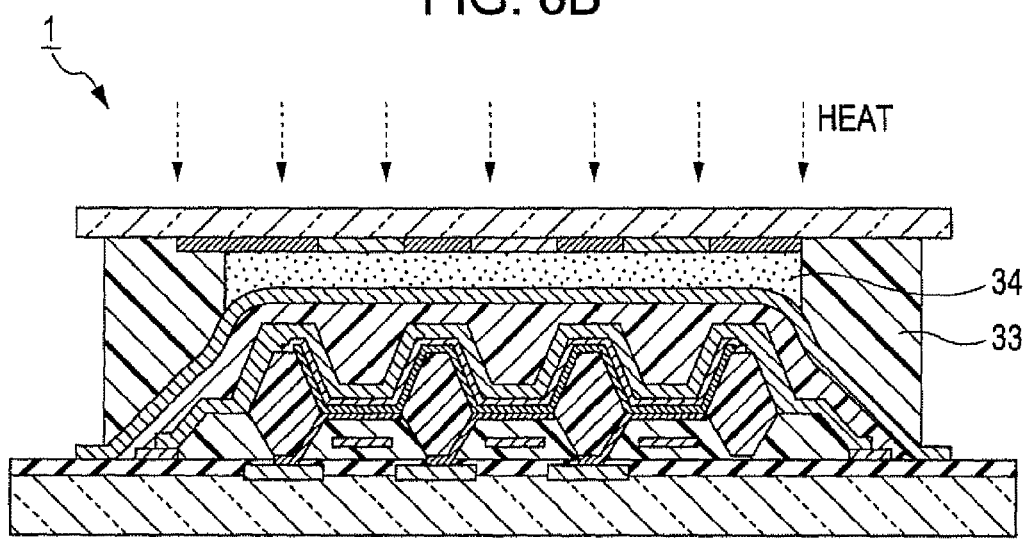
FIG. 6B is a diagram showing a process of producing the organic EL device according to the first Embodiment.

Then, as shown in FIG. 6B, the substrates are bonded to each other by pressure bonding and then heated (post baking) in the air to complete the curing of the formation materials of the sealing layer 33 and the adhesive layer 34.

Thus, the organic EL device 1 in this Embodiment can be obtained

In the organic EL device 1 having the above-described configuration, the gas barrier layer 19 has a laminated structure composed of the first gas barrier layers 19a made of silicon oxynitride exhibiting a high gas barrier property and the second gas barrier layers 19b made of silicon oxide (SiO$_2$) exhibiting relatively low Young's modulus, which allows deformation against stress. Consequently, the gas barrier layer 19 is provided with high endurance and enables to produce an organic EL device 1 with high reliability.

In addition, in this Embodiment, the second gas barrier layer 19b is formed so as to have a thickness of 1 nm. Therefore, the gas barrier layer 19 can have both high endurance and a high gas barrier property.

Furthermore, in this Embodiment, the elevation angle θ1 at the peripheral end of the organic buffer layer 18 is 10 degrees. Accordingly, at the peripheral end of the organic buffer layer 18r the gas barrier layer 19 covering the organic buffer layer 18 does not follow the underlying shape, that is, does not form a steep angle. Consequently, the gas barrier layer 19 at the periphery of the organic buffer layer 18 can be prevented from being damaged.

According to the process of producing an organic EL device, a thin film as the second gas barrier layer 19b can be easily formed, and the organic EL device having satisfactory endurance can be easily produced.

In addition, in this Embodiment, the second gas barrier layer 19b is formed by oxidizing part of the surface of the first gas barrier layer 19a, but it may be formed by laminating.

Furthermore, in this Embodiment, the organic EL device is a top-emission type, but it may be a bottom-emission type.

Second Embodiment

FIGS. 7A and 7B are explanatory diagrams of an organic EL device according to a second Embodiment of the invention. The organic EL device of this Embodiment is partially the same as the organic EL device of the first Embodiment. A difference between them is that the auxiliary wiring does not function as the protection layer of the cathode and an electrode-protecting layer for protecting the cathode is provided. Accordingly, in this Embodiment, the same components as those in the first Embodiment are denoted by the same reference numerals, and the detailed descriptions thereof are omitted.

As shown in FIG. 7A, auxiliary cathode wiring 24 for assisting electrical conduction between a cathode 11 and cathode wiring 22A is provided at the end of the cathode 11, and an electrode-protecting layer 17 covers the entire surfaces of the cathode 11, the cathode wiring 22A, and the auxiliary cathode wiring 24. This electrode-protecting layer 17 can prevent the cathode 11 and the underlying light-emitting layer 12 from being broken, even if the cathode 11 is significantly thin (20 nm or less) such that it can have translucency. In addition, the electrode-protecting layer 17 can prevent infiltration of oxygen and moisture into the light-emitting elements 21 and thereby can suppress deterioration of the light-emitting elements 21 due to oxygen and moisture.

The electrode-protecting layer 17 of this Embodiment has a structure that is, as in the gas barrier layer 19, composed of alternately laminated layers of a silicon compound (such as silicon nitride or silicon oxynitride) containing nitrogen and an oxide thereof. The thickness of the electrode-protecting layer 17 is preferably in the range of 100 nm or more and 400 nm or less. For example, when the electrode-protecting layer 17 has a thickness of about 3 to 5 µm, the asperities due to the partition wall 13 can be completely embedded in the layer, but such a layer is lack of flexibility and causes high film stress and therefore is not preferable.

As shown in FIG. 7B, the electrode-protecting layer 17 is, as in the gas barrier layer 19, composed of alternately laminated first protecting layers 17a (third inorganic film, material film) made of a silicon compound containing nitrogen and second protecting layers 17b (fourth inorganic film, oxide film) made of an oxide of the formation material of the first protecting layer. The electrode-protecting layer 17 can be formed by the same process as that of the gas barrier layer 19.

The electrode-protecting layer 17 is provided so as to be in contact with the gas barrier layer 19, and the electrode-protecting layer 17 and the gas barrier layer 19 seal the organic buffer layer 18. The elevation angle (angle of the peripheral end) θ2 of the organic buffer layer 18 at the peripheral end to the surface of the electrode-protecting layer 17 is preferably 20 degrees or less and is particularly preferably about 10 degrees. In this Embodiment, the elevation angle θ2 is 10 degrees.

In the organic EL device 2 having the above-described configuration, infiltration of moisture from the external atmosphere can be further effectively suppressed. This enables to produce an organic EL device having further high endurance and high quality.

Electronic Apparatus

Figure 8A:
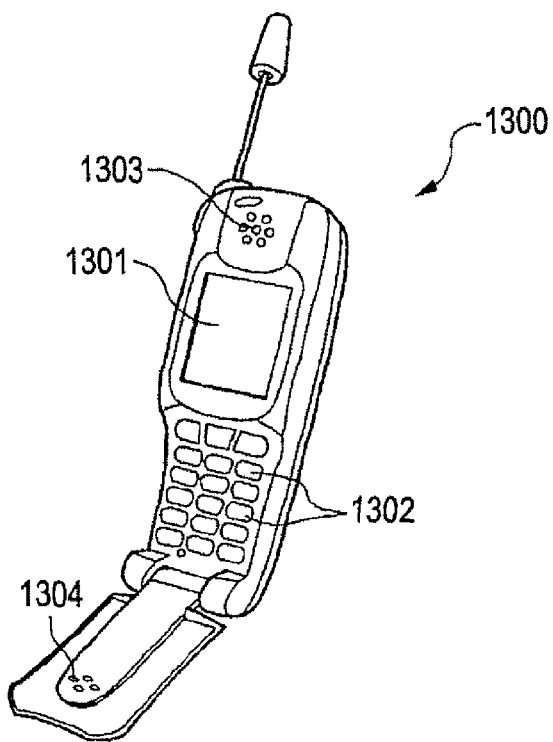
FIG. 8A is a perspective view showing an example of electronic apparatus of the invention.
Figure 8B:
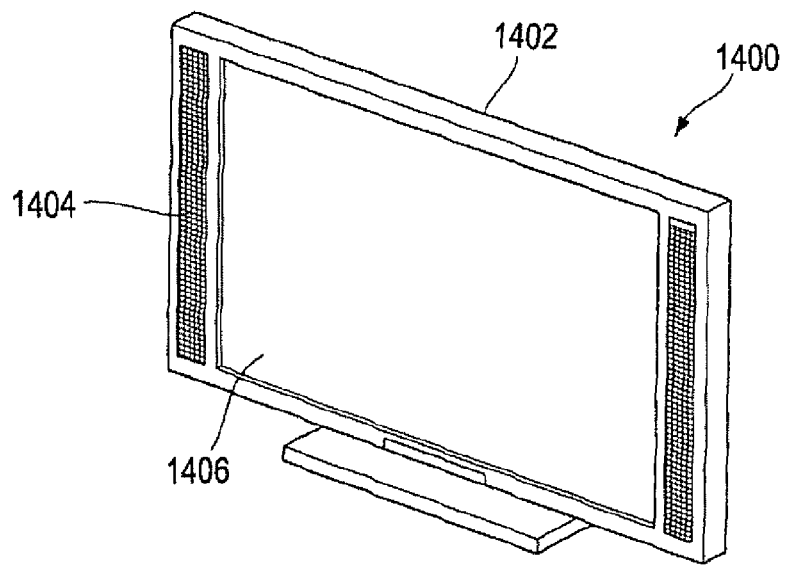
FIG. 8B is a perspective view showing an example of electronic apparatus of the invention.

Next, an Embodiment of the electronic apparatus according to the invention will be described. FIGS. 8A and 8B show examples of electronic apparatuses including the organic EL device of the invention. FIG. 8A is a perspective view of a mobile phone, and FIG. 8B is a perspective view of a television receiver. FIG. 8A shows an example in which the organic EL device of the invention is applied to a compact panel such as the display of mobile phone, and FIG. 8B shows an example in which the organic EL device of the invention is applied to a large panel such as the display of a flat-screen television.

The mobile phone 1300 shown in FIG. 8A includes the organic EL device of the invention as a compact display 1301 and is configured of a plurality of operation buttons 1302, an ear piece 1303, and a mouthpiece 1304. With this, a mobile phone 1300 that is configured by the organic EL device of the invention and has a display excellent in display quality can be provided.

The television receiver 1400 shown in FIG. 8B includes a receiver body (chassis) 1402, an audio output unit 1404, such as a speaker, and a display 1406 having the above-mentioned organic EL device 1. With this, a large flat screen television 1400 that is light in weight and has a high quality display 1406 can be provided.

These electronic apparatuses include the organic EL devices of the invention and thereby allow displays thereof to have high endurance and long product lifetime.

Furthermore, the organic EL device of the invention can be suitably applied not only to the above-mentioned electronic apparatuses but also to electronic books, projectors, personal computers, digital still cameras, television receivers, view finder-type and monitor direct view-type video tape recorders, in-car navigation systems, pagers, electronic notepads, calculators, word processors, workstations, TV telephones, POS terminals, and apparatuses having touch panels as display means thereof. In such configurations, electronic apparatuses can have displays having high display quality and being excellent in reliability.

The preferred Embodiments according to the invention are described above, with reference to the attached drawings, but it is understood that the invention is not limited thereto. The shapes, combinations, and so on of the configuration members shown in the above-described Embodiments are merely examples and can be variously modified based on design requirement or the like in the range that does not apart from the gist of the invention.

EXAMPLE

An Example of the invention will now be described. In this Example, a test device for evaluation was produced as an organic EL device in order to confirm effect of the invention.

The test device used in this Example was produced by forming a magnesium film (mg film) on a glass support substrate, forming a thin-film sealing layer consisting of an electrode-protecting layer (SiON)/an organic buffer layer/a gas barrier layer so as to cover the Mg film, and bonding a glass opposite substrate to the thin-film sealing layer. The electrode-protecting layer was in contact with the support substrate so as to seal the Mg film and was also in contact with the gas barrier layer so as to seal the organic buffer layer.

The thicknesses of components of the test device used were as follows: Mg film: 50 nm, electrode-protecting layer (SiON): 400 nm, organic buffer layer: 3 μm, and gas barrier layer: 400 nm. In the test device of this Example, the gas barrier layer was composed of stacked eight SiON layers each having a thickness of 50 nm and thin oxide films formed by treating each SiON layer with oxygen plasma before formation of the overlying layer. On the other hand, in a test device of a Comparative Example, the gas barrier layer was composed of stacked eight SiON layers each having a thickness of 50 nm, but not treated with oxygen plasma.

In evaluation using these test devices, sealing performance of the thin-film sealing layer covering the cathode of the organic EL device was evaluated by using the Mg film as the cathode of the organic EL device and evaluating the degree of deterioration of the Mg film.

The thus prepared test devices were left in a high pressure accelerating life tester (pressure cooker tester) that was set to test conditions of an atmospheric pressure of 1.7 atm, a temperature of 120° C., and a relative humidity of 85% RH, for 500 hours, and then decomposition of the Mg films were visually evaluated.

The Mg film having a thickness of 50 nm of the test device has metallic luster and is opaque. When the Mg film is decomposed into MgO (magnesium oxide), the metallic luster of Mg is lost and the film becomes transparent. That is, if the Mg film after it has been left in the tester has such a decomposed portion, it indicates that the thin-film sealing layer was damaged and that water and air infiltrated from the damaged portion. Accordingly, the Mg film after it has been left in the tester was visually investigated for occurrence of decomposed portions for evaluation.

As a result, as shown in FIG. 9, no decomposition was observed in the Mg film of the test device of Example, whereas decomposition, a transparent portion, was observed at the periphery of the Mg film of the test device of Comparative Example.

It was confirmed by this result that the gas barrier layer having the configuration of the invention was improved in endurance and that the configuration of the invention is effective for solving the problem.

The entire disclosure of Japanese Patent Application No. 2008-190948, filed Jul. 24, 2008 is expressly incorporated by reference herein.

What is claimed is:

1. An organic electroluminescence device comprising:
   a substrate;
   a plurality of light-emitting elements arranged above the substrate, each of the plurality of light-emitting elements including a pair of electrodes and an organic light-emitting layer disposed between the electrodes;
   an organic buffer layer covering the plurality of light-emitting elements;
   a gas barrier layer covering the organic buffer layer; and
   a sealing layer that is arranged on the gas barrier layer, the sealing layer overlapping a peripheral end of the organic buffer layer,
   wherein
   the gas barrier layer has a structure wherein first inorganic films and second inorganic films are alternately stacked, wherein
   the first inorganic films contain a silicon compound containing nitrogen;
   the second inorganic films contain an oxide of the formation material of the first inorganic films and each have a thickness smaller than that of each first inorganic film;
   the numbers of the first inorganic films and the second inorganic films are each at least two; and a peripheral end of the gas barrier layer being arranged between a peripheral end of the substrate and a peripheral end of the sealing layer.

2. The organic electroluminescence device according to claim 1, further comprising:
an electrode-protecting layer disposed between the plurality of light-emitting elements and the organic buffer layer and covering the surfaces of the plurality of light-emitting elements,
wherein
the electrode-protecting layer has a structure wherein third inorganic films and fourth inorganic films are alternately stacked, wherein
the third inorganic films contain a silicon compound containing nitrogen;
the fourth inorganic films contain an oxide of the formation material of the third inorganic films and each have a thickness smaller than that of each third inorganic film; and
the numbers of the third inorganic films and the fourth inorganic films are each at least two.

3. The organic electroluminescence device according to claim 1, wherein the second inorganic film contains silicon atoms and oxygen atoms with a ratio in number of atoms of oxygen to silicon being one or more and two or less.

4. The organic electroluminescence device according to claim 1, wherein the second inorganic film has a thickness of 0.1 nm or more and 10 nm or less.

5. The organic electroluminescence device according to claim 2, wherein the fourth inorganic film contains silicon atoms and oxygen atoms with a ratio in number of atoms of oxygen to silicon being one or more and two or less.

6. The organic electroluminescence device according to claim 2, wherein the fourth inorganic film has a thickness of 0.1 nm or more and 10 nm or less.

7. The organic electroluminescence device according to claim 1, wherein the peripheral end of the organic buffer layer has an angle of 20 degrees or less.

8. A process of producing an organic electroluminescence device according to claim 1, comprising:
forming a material film containing a silicon compound containing nitrogen; and
forming an oxide film containing an oxide of the formation material of the material film on the surface of the material film by treating the surface of the material film with oxygen plasma.

9. An electronic apparatus including an organic electroluminescence device according to claim 1.

10. The organic electroluminescence device according to claim 1, wherein each of the second inorganic films is disposed between two first inorganic films, and at least two first inorganic films are disposed as the outermost layers of the gas barrier layer.

11. The organic electroluminescence device according to claim 1, the sealing layer being disposed to only overlap the peripheral end of the organic buffer layer, and the sealing layer being disposed only between the plurality of light-emitting elements and the peripheral end of the gas barrier layer.

12. The organic electroluminescence device according to claim 1, the sealing layer being directly disposed only on the peripheral end of the gas barrier layer.

* * * * *